United States Patent [19]

Deunhouwer et al.

[11] 4,348,795
[45] Sep. 14, 1982

[54] METHOD OF MANUFACTURING COOLING BLOCKS FOR SEMICONDUCTOR LASERS

[75] Inventors: Anthony H. Deunhouwer; Hendrikus G. Kock, both of Eindhoven, Netherlands

[73] Assignee: U.S. Philips Corporation, New York, N.Y.

[21] Appl. No.: 157,139

[22] Filed: Jun. 6, 1980

[30] Foreign Application Priority Data

Jun. 11, 1979 [NL] Netherlands ......................... 7904550

[51] Int. Cl.³ ............................................ B23P 17/00
[52] U.S. Cl. ........................................ 29/411; 29/424
[58] Field of Search ................. 29/411, 412, 417, 418, 29/419, 423, 424

[56] References Cited

U.S. PATENT DOCUMENTS

| | | | |
|---|---|---|---|
| 2,762,954 | 9/1956 | Leifer | 29/424 UX |
| 3,149,407 | 9/1964 | Stockton et al. | 29/411 X |
| 3,165,824 | 1/1965 | Barney | 29/411 |
| 3,613,228 | 10/1971 | Cook et al. | 29/411 X |
| 3,685,110 | 8/1972 | Randolph | 29/424 X |
| 4,268,946 | 5/1981 | Eisenberg | 29/424 |

Primary Examiner—Ervin M. Combs
Attorney, Agent, or Firm—Thomas A. Briody; Robert T. Mayer; Steven R. Biren

[57] ABSTRACT

A method of manufacturing cooling blocks for semiconductor lasers, in which the rounding-off radius of the line of intersection between two surfaces of the cooling blocks must have a very small value. In the method, two bodies to be formed into cooling blocks are each provided with a flat surface and these bodies are secured together with their flat surfaces by means of a curable adhesive. One side of the bodies connected together is subjected, transverse to the two surfaces connected together, to a machining treatment so as to obtain a further flat surface, in which machining treatment deformation and burring of the bodies near the line of intersection to be formed is avoided due to the presence of the cured adhesive, and a line of intersection having a rounding-off radius of only a few microns is formed.

5 Claims, 6 Drawing Figures

METHOD OF MANUFACTURING COOLING BLOCKS FOR SEMICONDUCTOR LASERS

BACKGROUND OF THE INVENTION

The invention relates to a method of manufacturing cooling blocks for semiconductor lasers, which cooling blocks have at least two surfaces intersecting each other along a straight line, the rounding-off radius between said two surfaces having a small value.

It is known that semiconductor laser elements must be cooled very thoroughly so as to obtain a sufficiently long life. For that purpose, the laser element must be connected to a cooling block throughout its length via a low thermal resistance connection.

In many applications of semiconductor lasers it is desirable for the laser element to be accommodated very close to the edge of the cooling block, that is to say, a laser mirror is located at most a few microns from a side face of the cooling block. This is necessary, for example, to obtain an efficient optical coupling with a mono-mode fiber for use in optical communication. This location is also necessary to avoid reflections at the surface of the cooling block.

In very accurate machining techniques, for example, electro-erosive metal removing, the radius of the rib of, for example, a cubical cooling block will still have a value of 20 microns or more. In mechanical machining processes the radius is larger, while furthermore a slight crumbling away of the rib may take place and burring may occur.

When in a cooling block, the rounding-off radius of the rib is 20 microns or larger, a mirror of the laser element is present at a distance of a few microns from the side wall, a part of the laser element will make at best a poor thermal contact with the cooling block, which adversely influences the life of the device.

SUMMARY OF THE INVENTION

It is the object of the invention to provide a method of manufacturing cooling blocks for semiconductor laser elements in which at least the line of intersection formed by the supporting surface for the laser element and the side surface near which one of the mirrors of the laser element will be placed, shows an extremely small rounding-off radius, preferably smaller than 2 microns. To this end, the method according to the invention is characterized in that two bodies to be formed into cooling blocks are each provided with a flat surface, that these flat surfaces are secured together by means of a curing adhesive, that one side of the bodies connected together is subjected to a machining treatment transversely to the two surfaces connected together so as to obtain a further flat surface, in which machining treatment a deformation and burring of the bodies near the said line of intersection to be formed is avoided due to the presence of the cured adhesive, and that the adhesive is removed, if desired, after machining further surfaces.

The use of the curable adhesive during the machining treatment, such as milling or sawing, avoids the possibility of deformation, burring or crumbling away of the material of the cooling block at the area of the line of intersection to be formed. Thus a corner is formed having an extremely small rounding-off radius.

A favorable embodiment of the method in accordance with the invention is characterized in that starting from material in the form of metal rods, the rods are provided with two oppositely located parallel flat surfaces, a number of rods are secured together along their parallel surfaces by means of a curable adhesive, and transverse to the connection surfaces two further oppositely located parallel flat surfaces are formed by a machining treatment, after which the assembly of rods is divided into parts by a sawing operation transverse to its longitudinal direction.

A number of cooling blocks are formed simultaneously, each block showing a number of lines of intersection having a radius of less than 2 $\mu$m.

An embodiment favorable for industrial application is characterized in that before dividing into parts, a number of the said assemblies of rods are stacked on each other and are secured together by means of a curable adhesive, all rods extending parallel, then the body thus formed is divided into parts by a sawing treatment, a machining treatment transversely to the direction of sawing is applied to the parts, and the adhesive is then removed by dissolving.

In this manner, cooling blocks, for example, in the form of cubes having ribs with a rounding-off radius of less than 2 $\mu$m, can be formed in series production.

As a curable adhesive an epoxy resin may preferably be used. An epoxy resin including acryl-nitrile butadiene has proved extremely suitable.

The invention also relates to a semiconductor laser comprising a semiconductor laser element connected to a cooling element and having connections for the supply of voltage to the semiconductor element. According to the invention, the cooling element is constructed as a prismatic block of which at least one rib has a rounding-off radius of less than 2 $\mu$m, the semiconductor laser element is connected with one of its mirror faces parallel to the rib at a distance of less than 5 $\mu$m from the edge of the cooling member, and a supporting block of insulating material is provided on the connection face, a band-shaped connection conductor being connected with one end to the semiconductor laser element and being supported by the supporting block.

The invention will now be described in greater detail with reference to embodiments shown in the drawing.

DETAILED DESCRIPTION

Figure 1:
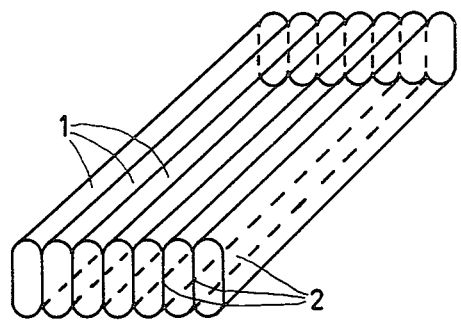
FIG. 1 shows a plurality of rods from which cooling blocks are manufactured.

FIG. 1 shows a plurality of rods 1 which are formed, for example, from a copper wire which has been rolled flat. The flat sides of the rods 1 have preferably been made truly flat, for example, by means of a milling treatment. The rods 1 face each other with their flat sides and are formed into a unit by means of an adhesive between the flat sides 2. An epoxy adhesive is preferably used. An epoxy adhesive including acryl-nitrile butadiene has proved very suitable. The adhesive is cured under pressure at a temperature of, for example, 150° C. The thickness of the layer of adhesive is preferably kept small and may be a few μm dependent on the smoothness of the surfaces and the pressure used.

Figure 2:
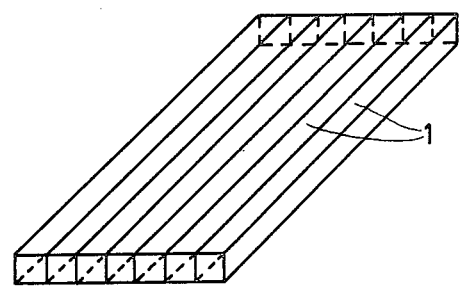
FIG. 2 shows an assembly of milled rods which are connected together.

The rods thus connected are subjected to a machining treatment, for example milling, in a direction perpendicular to the faces 2 adhered together. An assembly as shown in FIG. 2 is then obtained. If the rods would have been milled one by one, the radius of the formed lines of intersection between upper surfaces and side surfaces, and between lower surfaces and side surfaces, would have a comparatively large value of more than 20 μm. Furthermore, pieces of material would have crumbled away and burring would have occurred. The effect of the cured adhesive between the rods is that the stacked assembly of rods acts as a homogeneous assembly for the milling treatment, in which the milling head does not feel a transition between the rods. The surface to be milled therefore becomes completely smooth; crumbling away and burring at the lines of intersection does not occur. If the adhesive between rods would now be dissolved, the formed lines of intersection would appear very sharp with a rounding-off radius of less than 2 μm. It has even proved possible to reach a rounding-off radius of 0.2 μm.

Figure 3:
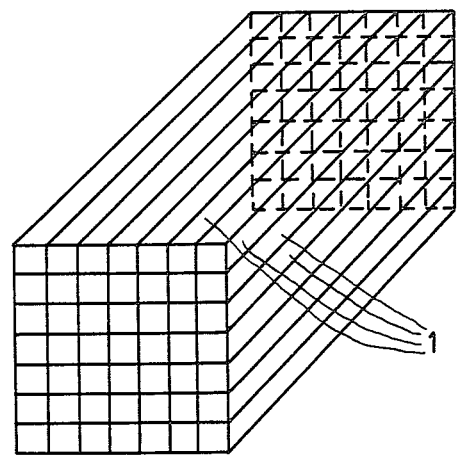
FIG. 3 shows a stack of assemblies of FIG. 2.

The assembly shown in FIG. 2 may now be sawn into wafers and the adhesive may be dissolved. Blocks would be obtained of which a number of lines of intersection have an extremely small radius. However, it is to be preferred to stack a number of the assemblies shown in FIG. 2 with the interposition of a curable adhesive to form a packet as is shown in FIG. 3. The stack is put under pressure, the adhesive being cured at a temperature of, for example, 150° C.

Figure 4:
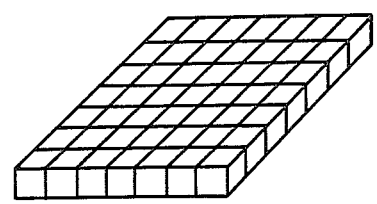
FIG. 4 shows a wafer sawn from the packet shown in FIG. 3.
Figure 5:
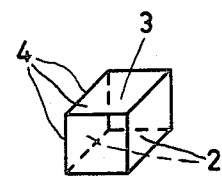
FIG. 5 shows a cooling block to cool a semiconductor laser.

The stacked rods are then sawn into wafers, as shown in FIG. 4. If desired, the wafers after sawing are after-milled so as to obtain a smooth surface. The wafers comprise a number of blocks still adhered together. All the ribs of these blocks which have been formed by machining operation of bodies adhered together have a very small radius of curvature of less than 2 μm. The blocks along the outer edge have a few ribs which have not been formed by machining operation of bodies adhered together; these ribs have a larger rounding-off radius. If desired, these outer blocks may be marked, after which the adhesive is removed by means of a solvent. Blocks as shown in FIG. 5 are then obtained. The blocks 3 have a particularly smooth surface, oppositely located surfaces are accurately parallel and the ribs 4 have an extremely small rounding-off radius.

Figure 6:
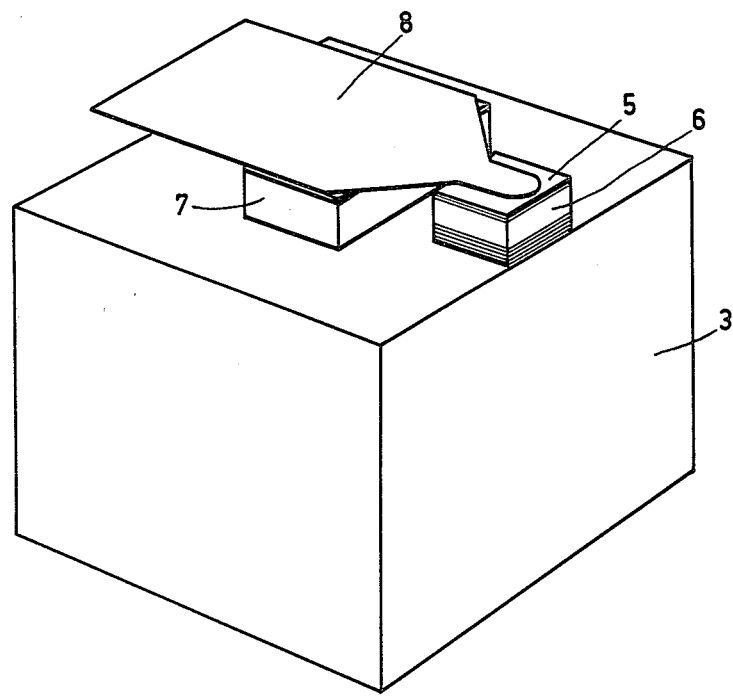
FIG. 6 shows a cooling block having a laser element and a strip-shaped conductor.

FIG. 6 shows an example of the use of the cooling block thus formed, which use is suitable in optical fiber communication. The connection of the semiconductor laser and of a current conductor is such that a favorable cooling and a low electric inductance occurs.

A semiconductor laser element 5 is provided on the cooling block 3. The connection may be made, for example, by means of indium solder. A mirror face 6 of the laser element is at a distance of at most a few μm from the edge of the cooling member. This may be necessary so as to obtain an efficient optical coupling of the laser to an optical fiber. This may also be necessary to prevent reflections of the laser light with the metal surface of the cooling block. Since the ribs of the block 3 have a rounding-off radius of less than 2 μm, the laser element 5 will be connected to the cooling member over its lower surface, including the part of the lower surface which is situated near the edge of the cooling block. As a result of this the laser element experiences an optimum cooling effect.

A ceramic spacer element 7 is provided on the cooling block by means of, for example, an epoxy adhesive. A strip-shaped conductor 8 extends above the cooling block, from the upper surface of the laser element 5 via the insulating supporting block 7 to the side of the cooling block. As a result of the construction shown, only a small inductance occurs, which is favorable when the laser is used for optical communication.

It will be obvious that the cooling block can be used in many applications other than lasers for optical communication. It will nearly always be desired to secure the laser element as close as possible to the edge of the cooling element, and the cooling block according to the invention is particularly suitable for this purpose. A favorable further application is, for example, in scanning record carriers comprising optically readable information structures. The information structures may relate, for example, to video or audio. In such an application the laser element is also placed with a mirror face at a few μm distance from the edge of the cooling block. Furthermore, a control diode is also placed on the surface where the laser element is present. In order to obtain a suitable connection surface of the diode on the cooling block, it may be favorable to give the diode a cubical construction.

What is claimed is:

1. A method of manufacturing cooling blocks for semiconductor lasers, which comprises:
   providing each of a plurality of bodies to be formed into cooling blocks with flat surfaces;
   fastening said flat surfaces together with a thin layer of a curing adhesive;
   machining said bodies in a direction transverse to that of said flat surfaces to obtain a further flat surface which intersects said flat surfaces of said bodies to define edges for each of said bodies, said edges having rounding-off radii of less than about two microns, said thin layer of curing adhesive substantially preventing deformation and burring of the edges of said bodies at said further flat surface during machining;
   further machining said bodies to form said cooling blocks; and
   removing said adhesive and separating said bodies into individual cooling bodies.

2. A method as claimed in claim 1, wherein said bodies to be formed comprise metal rods, each rod is provided with two oppositely located parallel flat surfaces, the rods are fastened together along their parallel surfaces to form an assembly by means of said curable adhesive, and two further oppositely-located parallel flat surfaces are formed transverse to the fastened surfaces by a subsequent machining treatment, after which the assembly of rods is divided into parts by a sawing operation transverse to its longitudinal direction.

3. A method as claimed in claim 2, wherein, before dividing into parts, a plurality of said assemblies of rods are stacked on each other and are secured together by means of said curable adhesive, all of said rods extending parallel to each other, the body thus formed is then divided into parts by said sawing treatment, a machining treatment transverse to the direction of sawing is then applied to the parts, and the adhesive is then dissolved.

4. A method as claimed in claim 1, 2 or 3, wherein an epoxy resin is used as the curable adhesive.

5. A method as claimed in claim 4, wherein the epoxy resin includes acryl-nitrile butadiene-styrene.

* * * * *